United States Patent [19]
Oh

[11] Patent Number: 4,569,701
[45] Date of Patent: Feb. 11, 1986

[54] TECHNIQUE FOR DOPING FROM A POLYSILICON TRANSFER LAYER

[75] Inventor: Kye H. Oh, Allentown, Pa.

[73] Assignee: AT&T Bell Laboratories, Murray Hill, N.J.

[21] Appl. No.: 596,850

[22] Filed: Apr. 5, 1984

[51] Int. Cl.$^4$ .................. H01L 21/385; H01L 21/225
[52] U.S. Cl. ........................................ 148/188; 29/571; 29/576 W; 29/578; 148/186; 148/187
[58] Field of Search .................... 29/576 W, 571, 578; 148/188, 187, 186

[56] References Cited

U.S. PATENT DOCUMENTS

| | | | |
|---|---|---|---|
| 4,026,733 | 5/1977 | Owen et al. | 148/187 X |
| 4,063,967 | 12/1977 | Graul et al. | 148/188 X |
| 4,072,545 | 2/1978 | De La Moneda | 148/188 X |
| 4,074,304 | 2/1978 | Shiba | 148/188 X |
| 4,104,086 | 8/1978 | Bondur et al. | 148/1.5 |
| 4,239,559 | 12/1980 | Ito | 148/187 X |
| 4,353,086 | 10/1982 | Jaccodine et al. | 357/51 |
| 4,389,255 | 6/1983 | Chen et al. | 148/188 X |
| 4,431,460 | 2/1984 | Barson et al. | 148/188 X |

OTHER PUBLICATIONS

*IEEE Electron Device Letters*, vol. EDL-4, No. 11, Nov. 1983, pp. 411-414, T. Morie, K. Minegishi and S. Nakajima, "Depletion Trench Capacitor Technology for Megabit Level MOS dRAM".

*Primary Examiner*—George T. Ozaki
*Attorney, Agent, or Firm*—Peter V. D. Wilde

[57] ABSTRACT

For trench isolation technology or trench capacitor type memory cells, it is necessary to controllably dope the steep sidewalls of the trench. Implantation is ineffective and chemical doping sacrifices control.

A thin transfer layer of polysilicon is deposited in the trench to conformally coat the sidewalls as well as the bottom of the trench and the top surface surrounding the trench. An impurity is implanted into the polysilicon at the bottom of the trench and around the top surface. Upon heating that impurity diffuses rapidly along the polysilicon layer inwardly and downwardly along the sidewalls. It then may be diffused into the substrate. The polysilicon layer may be etched away, or may be oxidized to SiO$_2$ and etched away, or left in place.

14 Claims, 10 Drawing Figures

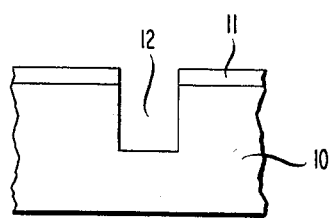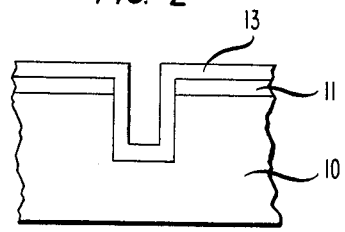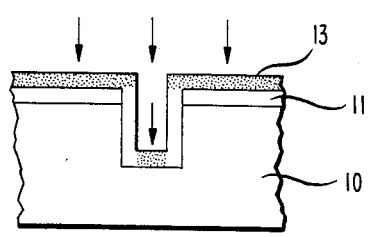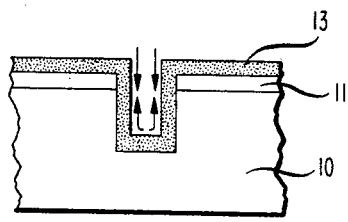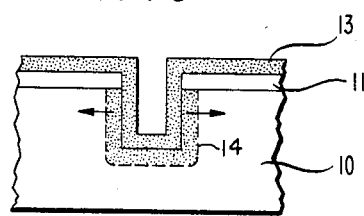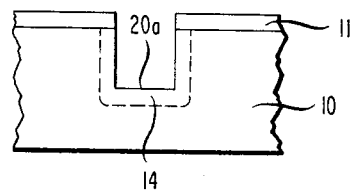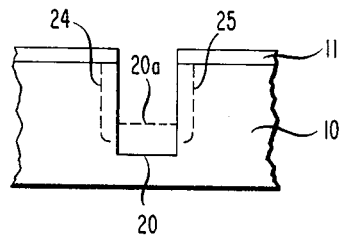

TECHNIQUE FOR DOPING FROM A POLYSILICON TRANSFER LAYER

BACKGROUND OF THE INVENTION

Semiconductor integrated circuit devices are built essentially in two dimensions. As the size of these devices continues to shrink, fundamental limitations on further size reductions are approached. An apt example is the capacitor in semiconductor memory devices. It has been reduced in size to the point where the charge capacity barely exceeds charge levels produced by noise mechanisms, e.g. alpha particle noise. It is inevitable that future devices will be constructed in three dimensions, opening a new horizon for microcircuit technology. One such approach has already been proposed and, in principle, built. See U.S. Pat. No. 4,353,086. See also IEEE Electron Device Letters, Vol. EDL-4, No. 11, November, 1983, Morie et al. The essence of the approach is to build the memory cell capacitor vertically into the substrate. This so-called trench or wall capacitor has a predominant portion of the storage plate extending into rather than along the chip surface. The amount of surface area consumed is only the area of the trench at the surface. For example, a simple trench capacitor $1\mu \times 4\mu \times 5\mu$ (in depth) consumes $4\mu^2$ of chip surface area. The memory plate area available using the sidewalls of the trench is $5\mu \times 4\mu$ per sidewall and $1\mu \times 5\mu$ per endwall for a total of $50\mu^2$, or more than a tenfold increase in charge capacity over a $4\mu^2$ conventional memory plate with the same oxide thickness (neglecting the bottom of the trench). For a mesa type structure as described in the aforementioned patent, a $2\mu \times 2\mu \times 5\mu$ mesa consumes $4\mu^2$ of chip area (neglecting isolation which in this structure is small) but provides a four walled capacitor area of $40\mu^2$.

The advantage of using vertical structures is obvious. However it is not obvious how to make them most effectively.

One ingredient that will be found in a variety of these kinds of structures, including that just described, is a vertical sidewall that is doped selectively with a conductivity type determining impurity in a controlled shallow region. "Doped selectively" is intended to describe an impurity region having an impurity level or kind different from the portion of the substrate into which the trench is formed. Doping such a sidewall by chemical diffusion from an impurity rich vapor is straightforward but does not afford the degree of control over the impurity level and distribution (including depth) that is required for many current devices. Doping a vertically extending sidewall by ion implantation, a process that normally does afford the desired shallow depth and controlled concentration, is difficult because the ion implanting beam is highly directional and does not effectively impact the sidewall.

STATEMENT OF THE INVENTION

According to this invention a transfer layer is deposited over the entire trench, i.e. the top (the surface of the substrate immediately surrounding the trench), the bottom, and the sidewalls of the trench. The desired ions are then implanted into the transfer layer at the top and/or bottom of the trench. These regions extend horizontally and are easily implanted. The portion of the transfer layer covering the sidewalls will be largely devoid, at this point, of impurities. The structure is then heated to diffuse the impurities downwardly from the top and/or upwardly from the bottom of the trench into the sidewall portion of the transfer layer. Further heating causes the impurities in the sidewall portion of the transfer layer to diffuse into the sidewall of the trench itself creating the desired impurity region. The transfer layer comprises a material in which the diffusion rate of impurities is high (e.g. $5\times$) relative to the rate in single crystal silicon. The preferred material is polysilicon or amorphous silicon in which these rates differ by more than an order of magnitude. Another recommended material is refractory metal silicide, e.g. $TaSi_2$ or $WSi_2$.

BRIEF DESCRIPTION OF THE DRAWINGS

FIGS. 1-6 are schematic representations of steps in a process for doping sidewalls in accordance with the invention;

FIGS. 7 and 8 are similar schematics for another embodiment;

DETAILED DESCRIPTION

Figure 8:
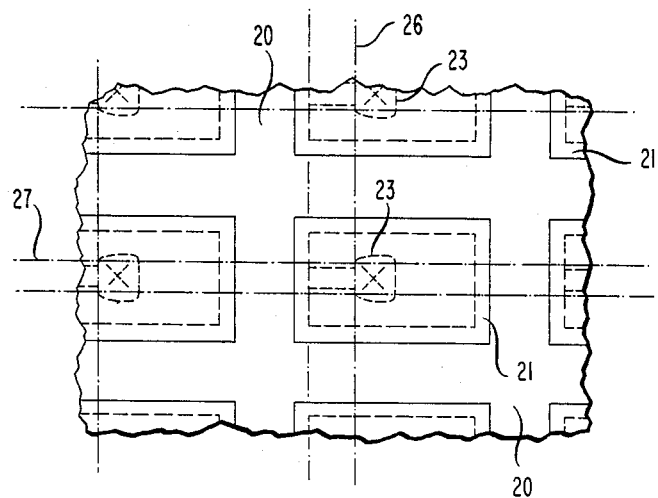

FIG. 1 illustrates schematically a semiconductor substrate 10 having a trench 12 formed therein by any of a variety of known techniques. Most typically the substrate 10 is silicon and, for example, is p-type. In this exemplary embodiment layer 11, of e.g. $SiO_2$, covers the substrate surface. The trench can be formed by applying a masking layer 11, opening a window in layer 11 by reactive ion etching (RIE) and RIE etching the substrate anisotropically to form trench 12. Anisotropic dry etching processes, using for example RIE, are known in the art and are capable of forming trenches with nearby vertical sidewalls and aspect ratios, depth to width, greater than one. See, e.g. U.S. Pat. No. 4,104,086 issued Aug. 1, 1978 to Bondur et al. For the purposes of this invention "vertical" is intended to mean 90° to the surface ±20°, and suitable aspect ratios are of the order of one or more. (Sidewalls of shallow recessions can be implanted directly by tilting the substrate, or can be doped from the surface by forming the impurity region into a planar surface and etching the trench into and within the impurity region.)

Subsequent to formation of the trench a transfer layer 13, preferably polysilicon, or amorphous silicon is deposited covering the entire trench, FIG. 2. This layer is advantageously formed by CVD to insure coverage of the sidewalls of the trench. Thickness of layer 13 is not critical but typically is at least 500Å to ensure wall coverage. In this embodiment layer 11 is shown interposed between the polysilicon layer 13 and the substrate surface to prevent doping of the surface as will be seen. However applications may be found where doping of the surface is desirable in which case layer 11 is absent or removed prior to depositing the polysilicon layer.

The structure shown in FIG. 2 is then ion implanted, FIG. 3, to deposit impurities in the layer 13 as shown. Due to the directional nature of the ion beam, relatively few impurities deposit in the sidewall portions of layer 13. If the device being made is a storage capacitor for an n-channel access transistor, the substrate 10 will be p-type and a recommended implant is arsenic or phosphorus at $1 \times 10^{14}/cm^2$. The implanted structure is then heated to diffuse the implanted impurities upwardly from the bottom and/or downwardly from the top as shown schematically in FIG. 4. Impurities such as phosphorus diffuse rapidly along the sidewall at temperatures of the order of 950° C. Upon further heating substantial doping of the sidewall of the substrate occurs as shown in FIG. 5, thus forming the desired p-n junction 14. Diffusion time of the order of 30 minutes to 2 hours is adequate to produce this result. As represented in FIGS. 4 and 5 the impurities are shown as diffusing throughout the layer 13 and thereafter into the substrate 10. Due to the more rapid diffusion of impurities in polysilicon (layer 13) as compared with single crystal silicon (substrate 10), that is (qualitatively) what occurs and is responsible for the success of this technique. However, on a strict quantitative basis the process does not occur in distinct steps as shown but occurs simultaneously at different rates, as will be evident to those skilled in the art.

After completion of the sidewall, doping layer 13 may, if desired, be removed. A preferred way of removing layer 13 is to oxidize it completely, by known thermal techniques. Removal of the resulting oxide layer by known selective etching is straightforward. Alternatively, the oxide layer may remain to function as the dielectric for the capacitor. Applications may arise for retaining layer 13, e.g. in making diodes, or ohmic contacts to substrate 10. In the case of the latter boron is suitable as the impurity.

If the structure of FIG. 6 is to be employed as a capacitor in a memory device, a dielectric layer is grown or deposited in the trench and a conductive layer is applied thereover, e.g. as described in U.S. Pat. No. 4,353,086. The dielectric is typically $SiO_2$, grown by a thermal growth process and the conductive layer may be aluminum but is preferably polysilicon. The polysilicon layer may be deposited to a thickness that fills the trench to provide an essentially planar topology. The thermal diffusion process described by FIGS. 4 and/or 5 can be advantageously effected in conjunction with the growth of the dielectric layer for the memory cell. The dielectric layer may also be produced by oxidation of the transfer layer as indicated earlier.

The trench capacitor arrangement described in U.S. Pat. No. 4,353,086 requires isolation between facing sidewalls. An approach for manufacturing this structure is shown in FIGS. 7 and 8. Isolation at the bottom of the trench is achievable, for example, by etching the trench at 20a of FIG. 7 anisotropically to remove the implanted region connecting the sidewall capacitors at the bottom of the trench. The capacitors 24 and 25 become disconnected as shown in FIG. 7. The resulting structure with access transistor 23, word lines 26 and bit lines 27 added is shown in FIG. 8.

Figure 9:
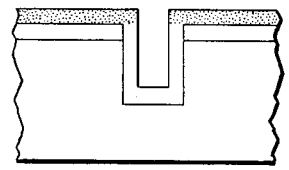
FIGS. 9 and 10 illustrate a variation of the scheme described in association with FIGS. 1-6.
Figure 10:
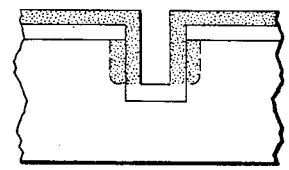

As described above doping of the sidewalls results from impurities ascending the sidewall from the bottom of the trench as well as descending from the bottom. As shown in FIGS. 9 and 10 it can be sufficient to dope the sidewalls primarily from the top of the trench.

Another application of the technique described here is to making trench-isolated devices. For an n-channel trench-isolated structure the sidewall doping would be boron at a level of the order of $2 \times 10^{16}/cm^3$. Further details on trench isolation using conventional doping methods can be found in U.S. Pat. Nos. 4,104,086 and 4,353,086.

The following is given by way of example of a process sequence suitable for forming trench isolation structures. The sequence follows approximately the steps described in conjunction with FIGS. 1 to 6 except that layer 11 in this example includes a silicon nitride layer deposited on a silicon dioxide layer.

A structure similar to that shown in FIG. 1 is formed by RIE etching a trench 1$\mu$ wide and 5$\mu$ deep. Layer 11 consists of 175Å of grown oxide covered with 1200Å of silicon nitride. The polysilicon layer is 1000Å thick and is deposited by conventional CVD. The polysilicon layer is capped with 700Å of undoped oxide. The cap is optional and is recommended here to obtain the desired implant profile in the transfer layer and to minimize evaporation of impurities during subsequent heat treatments.

Boron is then implanted at 40 kev and $10^{13}/cm^2$. Followed by a drive-in step in nitrogen at 950° C. for 60 minutes. The polysilicon transfer layer is then oxidized through followed by an anneal at 950° C. for 60 minutes.

The transfer layer, now converted to oxide may remain in place. If desired the trench may be filled with dielectric material as described in U.S. Pat. No. 4,104,086.

The doping technique set forth herein has been described in terms of doping a sidewall. Those skilled in the art will recognize that the essential aspect of the proposed scheme is a means for doping a layer or portion of a layer that is relatively inaccessible to the implant beam. Such a layer or region might, for example, be situated underneath another layer, in which case a portion of a transfer layer that is accessible to the beam is implanted and the implanted impurities are thereafter diffused to a region of the transfer layer that is inaccessible to the ion beam. It is contemplated that the region of the transfer layer that is implanted will lie in one dimensional plane, typically normal or approximately normal to the ion implant beam, and the region to which the impurities are to be transferred may be along a vertical, or approximately vertical, plane inaccessible, or largely inaccessible to the ion beam, as in the case of the sidewalls described in detail herein, or the region to which the impurities are transferred may lie laterally with respect to the beam but inaccessible thereto due to intervening layers.

This transfer of impurities in a dimension lateral with respect to the substrate surface is one important characteristic of the invention. The extent of this transfer can be substantial. Although this can be argued that transfer of impurities through the thickness of certain layers has been practiced in the past those dimensions are quite modest, typically of the order of a fraction of a micron. One way of defining the lateral transfer case claimed here from the case just mentioned is to prescribe a length of lateral transfer that is substantially greater than the thickness of the transfer layer. Typically the latter will be on the order of a fraction of a micron while the former will be on the order of several microns.

Means for introducing the impurities may be by ion implantation as described above or by predeposit from a gas or vapor source, both cases followed typically by a thermal treatment. As in the example described here the site where the impurities are desired is typically inaccessible, or not conveniently accessible, to the conventional source of impurities. In the foregoing example the site was not conveniently accessible to the ion beam. Other situations may arise in which the site underlies one or more physical layers, making the site inaccessible to either an ion beam, a gas or vapor impurity source.

Difficulties may arise in some applications of the so-called trench technology due to effects occurring at the bottom of the trench. For example, layers deposited or formed at the bottom of the trench may exhibit nonuniformities. Since electric field effects are likely to be non-uniform in the vicinity of the corners of the trench, the potential for dielectric breakdown and other device failures is liable to be increased due to the corners and/or bottom of the trench. Moreover, stress effects within the substrate at these corners may encourage leakage of charge stored in the vicinity of the trench bottom. Therefore, it may be advantageous to utilize a structure like that shown in FIGS. 7 and 10 in which the storage layer does not extend to, or around, the corners of the trench bottom. A variety of ways will occur to those skilled in the art for effectively disabling possible adverse effects created by the corners and bottom of the trench.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Method comprising:
   forming a polysilicon transfer layer overlying a semiconductor substrate, said transfer layer contacting said substrate at a first location, introducing impurities into said transfer layer selectively at a second location substantially removed from said first location in a direction normal with respect to the thickness of the transfer layer, said first and second locations being separated by a distance substantially greater than the thickness of the transfer layer, to produce in the transfer layer a relatively high impurity concentration at said second location and a relatively low impurity concentration at said first location, and heating said transfer layer at a temperature and for a time sufficient to transfer impurities from said second location to said first location in the transfer layer, and thereafter into said substrate.

2. Method for introducing impurities into a semiconductor substrate comprising:
   forming at least one recession in the interior region of a planar single crystal semiconductor substrate, said recession including a sidewall portion and a bottom portion, said sidewall extending approximately vertically with respect to the plane of the substrate,
   depositing a transfer layer so as to substantially cover the sidewall portion of the recession, at least that portion of the surface of the substrate proximate the sidewall and/or the bottom portion of the recession, said transfer layer comprising a material in which the diffusion rate of said impurities is greater than in said substrate,
   implanting impurities into the portion of the transfer layer covering said surface portion and/or the bottom portion of the recession, and
   heating the substrate at a temperature and for a time sufficient to cause the implanted impurities to diffuse into at least significant parts of the transfer layer covering the sidewall portion and from that layer into the sidewall portion of the recession.

3. Method of claim 2 in which the diffusion rate of impurities in the transfer layer is at least five times the diffusion rate in the substrate.

4. Method of claim 2 in which the transfer layer is polysilicon or amorphous silicon.

5. Method of claim 2 in which the layer as deposited is substantially undoped.

6. Method of claim 2 in which the recession forms isolation between multiple devices in said substrate.

7. Method of claim 2 including the additional steps of forming a dielectric layer covering the substrate in the recession and depositing a conductive layer over the dielectric layer to form a capacitor.

8. Method of claim 7 in which the transfer layer is silicon and the dielectric layer is formed by oxidation of the silicon transfer layer.

9. Method of claim 2 in which the transfer layer is oxidized completely through its thickness.

10. Method of claim 9 in which the oxidized transfer layer is removed.

11. Method of claim 6 in which the recession is filled with a dielectric material after the sidewalls are doped.

12. Method of claim 7 in which the conductive layer is silicon.

13. Method of claim 12 in which the silicon layer substantially fills the recession.

14. Method of claim 2 in which a capping layer is formed over the transfer layer prior to the heating step.

* * * * *

UNITED STATES PATENT AND TRADEMARK OFFICE
CERTIFICATE OF CORRECTION

PATENT NO. : 4,569,701

DATED : February 11, 1986

INVENTOR(S) : Kye H. Oh

It is certified that error appears in the above-identified patent and that said Letters Patent is hereby corrected as shown below:

Section [57] ABSTRACT, paragraph 2, line 7 "inwardly" should read --upwardly--. Column 2, line 64 "$1 \times 10^{14}/cm^2$" should read --$1E14/cm^2$--.

Signed and Sealed this

Twenty-eighth Day of April, 1987

*Attest:*

DONALD J. QUIGG

*Attesting Officer*  *Commissioner of Patents and Trademarks*